United States Patent [19]

Kamada et al.

[11] 4,434,022

[45] Feb. 28, 1984

[54] PROCESS FOR MANUFACTURING COPPER-CLAD LAMINATE

[75] Inventors: Osao Kamada, Tokyo; Yoshiaki Matsuga, Ibaraki; Masami Watase, Ibaraki; Tadato Kudo, Ibaraki; Hiroyoshi Harada, Ibaraki; Atsushi Kanezaki, Ibaraki, all of Japan

[73] Assignee: Hitachi Cable Limited, Tokyo, Japan

[21] Appl. No.: 512,047

[22] Filed: Jul. 8, 1983

[30] Foreign Application Priority Data

Jul. 8, 1982 [JP] Japan ................... 57-119113

[51] Int. Cl.³ .................... C23F 1/00; B44C 1/22; B29C 19/04; C03C 15/00
[52] U.S. Cl. .................... 156/274.6; 156/274.8; 156/275.7; 156/629; 156/666; 204/129.1
[58] Field of Search ............ 204/129.1, 129.35, 32 R, 204/23, 25, 129.75; 156/629, 634, 654, 666, 272.2, 273.3, 274.6, 274.8, 275.7, 324, 901, 902

[56] References Cited

U.S. PATENT DOCUMENTS

| | | | |
|---|---|---|---|
| 1,954,403 | 4/1934 | Daly | 156/629 X |
| 2,313,422 | 3/1943 | Dimon | 204/129.1 |
| 3,779,877 | 12/1973 | Alwitt | 204/129.1 X |
| 3,876,479 | 4/1975 | Yamada | 204/129.1 X |

Primary Examiner—William A. Powell
Attorney, Agent, or Firm—Sughrue, Mion, Zinn, Macpeak & Seas

[57] ABSTRACT

A process for manufacturing a copper-clad laminate which includes a rolled copper foil as a circuit conductive material comprising, introducing a rolled copper foil through a power supply/guide roller into an electrolyte so as to pass between two parallel electrodes which are disposed in the electrolyte. An AC, DC or a combination thereof is supplied to the power supply/guide roller and the electrodes to form an etched layer on either one or both sides of the rolled copper foil. An adhesive is applied to the etched layer and the resultant rolled copper foil is pressed with a substrate made of a synthetic resin put together to form a laminate.

13 Claims, 7 Drawing Figures

4,434,022

PROCESS FOR MANUFACTURING COPPER-CLAD LAMINATE

BACKGROUND OF THE INVENTION

This invention relates to a process for manufacturing a copper-clad laminate which comprises a rolled copper foil as a circuit conductive material.

A printed board is a laminate which comprises a substrate made of a porous material, such as paper, glass and woven cloth, impregnated with a thermosetting resin such as phenolic resin, formalin resin and epoxy resin, and a thin copper foil laminated to the substrate. Thus, a printed board is commonly called a copper-clad laminate.

As copper foil for such a copper-clad laminate there has been consistently employed for the past several decades a so-called electrolytic copper foil which is produced by electrolytic deposition from a copper ion-containing solution. One of the reasons for the employment of electrolytic copper foil is that it is extremely difficult to produce a wide and thin copper foil by rolling process. Another is that metallic copper is inherently very poor in adhesion to synthetic resins. Thus, in practice, electrolytic-deposition is conducted such that the adherent surface of the resulting copper foil is roughened to form an electrolytic copper foil. The roughened surface of the copper foil is then electrochemically anodized to form a layer of minute cuprous oxide, or optionally copper oxide, of a few micron in thickness thereon. As a result of roughening followed by anodization, the adhesion of the copper foil is improved for practical use.

FIG. 1 is a cross section of view of an example of oxidized roughened electrolytic copper foil thus obtained. Shown at 1 and 2 are electrolytic copper and copper oxide (hereinafter, among with cuprous oxide, referred to as "copper oxide"), respectively. In general, a copper-clad laminate is produced by a process which comprises applying an adhesive on the roughened surface thus obtained on the copper foil, and then pressing the copper foil with the roughened surface opposed to a prepreg being preimpregnated with thermosetting resine partially curved to B-stage at a proper temperature and pressure, whereby the both are uniformly bonded to each other. In this case, the roughened surface which comprises minute particles of copper oxide serves to hold the adhesive and thus adds to the adhesion or the copper foil to the substrate. The effect of the oxidized roughened surface on the adhesion of the copper foil to the substrate can be clearly recognized in the inventors' study which gave the results that the peel strength of the aforementioned roughened copper foil from a paper-phenol base material to which it is laminated with a butylaric or phenolic adhesive tested in accordance with JISC 6481 reads high as 1.9 to 2.2 kg while that of a plain copper foil having no oxidized roughened surface tested on the same condition reads low as 0.2 to 0.5 kg.

However, a series of studies conducted by the inventors on high frequency electrical transmission characteristics such as a study of printed circuit boards in search for better tone in audio and study or printed circuit boards on resonance characteristic in television picture circuit made it clear that copper oxide which is provided on the surface of the copper foil for better adhesion has an adverse effect on high frequency response and the characteristics of the electrolytic copper foil itself is poorer than that of roller copper foil.

Furthermore, a closer observation of the interface between the copper foil and the substrate in the conventional copper-clad laminate showed that copper oxide particles 2 are deeply embedded in a substrate 3 of synthetic resin as shown in FIG. 2, providing a high adhesion. Accordingly, the conventional copper-clad laminate is disadvantageous in that even after etching following printing of a circuit pattern the copper oxide particles 2 which contain a copper oxide nucleus remain embedded in the substrate 3 as shown in FIG. 3. Such a laminate cannot be used as a circuit unless the particles 2 are removed by a stronger etching which can cause a so-called side etching of the copper foil. Therefore, if the conventional copper-clad laminate were used, conductor width and conductor spacing should be restricted than specified values.

As described above, a copper-clad laminate which employes the conventional oxidized roughened electrolytic copper foil has tow shortcomings associated with high frequency response and etching process for circuit formation.

SUMMARY OF THE INVENTION

Accordingly, this invention relates to a process for manufacturing a novel copper-clad laminate which is adapted to resolve these problems. In other words, it is the main object of this invention to form as means of providing adhesion to the substrate a large number of minute pores having a maximum depth of 10 μm and a minimum depth of 0.5 μm on the surface of a roller copper foil, particularly rolled oxiygen free copper foil which is excellent in high frequency response by electrochemically etching the foil.

DETAILED DESCRIPTION OF THE PREFERRED EMBODIMENT

Figure 1:
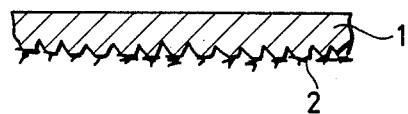
FIG. 1 is a cross sectional view of an example of oxidized roughened electrolytic copper foil.
Figure 2:
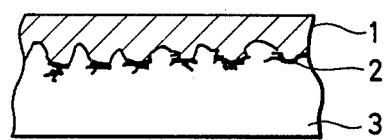
FIG. 2 is a cross sectional view of an example of interface between an oxidized roughened electrolytic copper foil and a substrate.
Figure 3:
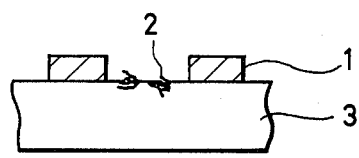
FIG. 3 is a cross sectional view of an example of printed circuit board on which a circuit has been just formed by etching.
Figure 4:
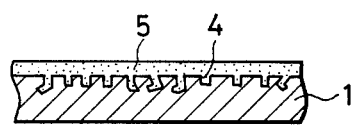
FIG. 4 is a cross sectional view of an example of interface between a roughened rolled copper foil obtained in accordance with this invention and an adhesive layer.

As commonly recognized, it is impossible to provide a strong adhesion to the smooth surface of copper. The inventors have found that the formation of a large number of minute pores having a maximum depth of 10 μm and a minimum depth of 0.5 μm on the smooth surface of a rolled copper foil by an electrochemical etching with DC or AC current or a combination thereof in an electrolytic is optimum in assuring a strong adhesion. Referring to FIG. 4, an adhesive 5 is shown immersed into pores 4 which have been formed by an electrolytic etching. Furthermore, the presence of these pores drastically increases the surface area of the copper foil. Thus, the adhesion of the adhesive to such a copper foil is substantially higher than to a smooth surfaced copper foil. A copper-clad laminate having a strong adhesion was then obtained by pressing the adhesive applied rolled copper foil with a synthetic resin-impregnated substrate put together at a proper temperature and pressure.

In accordance with this invention, the pores formed by etching should have a maximum depth of 10 μm and a minimum depth 0.5 μm. If the depth of the pores exceeds 10 μm, the copper foil is defective in mechanical strength and electrical resistance. On the other hand, if the depth of the pores is less than 0.5 μm, the adhesion of the foil to adhesive is not enough.

The rolled copper foil may be etched on either one or both sides. The etching of both sides not only assures a high adhesion to the base but also adds to the solderability of the circuit side of the foil.

Examples of suitable electrolytes which may be used in this invention are hydrochloric acid, sulfuric acid and nitric acid.

Figure 5A:
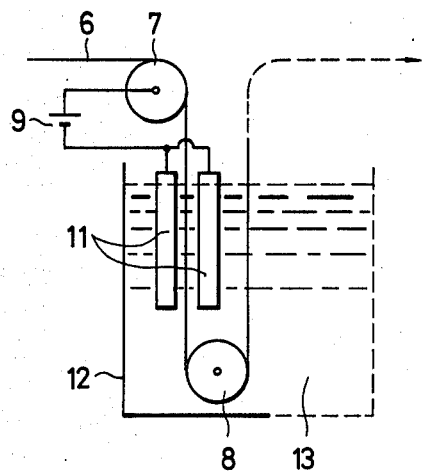
FIGS. 5A and 5B and FIG. 6 show three embodiments of this invention.
Figure 5B:
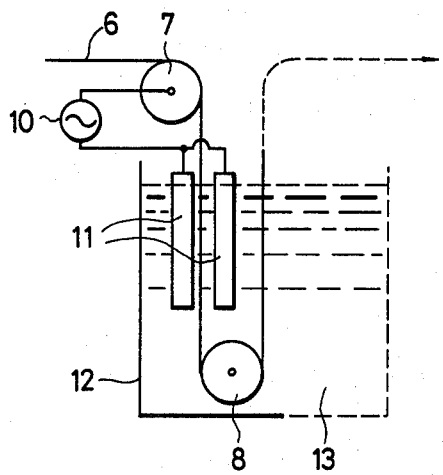
Figure 6:
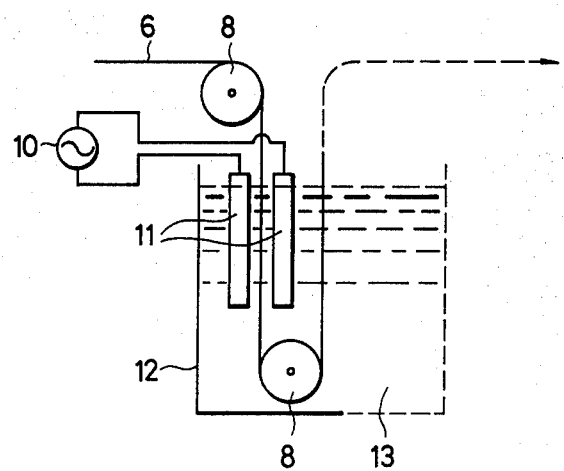

FIGS. 5A and 5D and FIG. 6 shows three examples of process for etching of a belt-shaped rolled copper foil under the direct and indirect supply of electric current, respectively. In FIGS. 5A, 5B and 6, numerals 6, 7, 8, 9, 10, 11, 12 and 13 are a rolled copper foil, power supply/guide roller, guide roller, DC power supply, AC power supply, electrode, tank and electrolyte, respectively.

In FIG. 5A, the positive and negative terminals of a power supply 9 are connected to the power supply/guide roller 7 and the electrodes 11, respectively, so that a direct supply of DC current is conducted. In FIG. 5B an AC current is directly supplied between the power supply/guide roller 7 and the electrodes 11. In FIG. 6, the terminals of the AC power supply are connected to the respective electrode 11 so that an indirect supply of electric current is conducted. In any case of FIGS. 5A and 5B and FIG. 6, additional electrodes may be provided for better etching efficiency. Alternately, these electrical supply systems may be combined to supply DC and AC currents to the foil. The direct electric supply system, and the indirect electric supply system shown in FIGS. 5A and 5B and FIG. 6, respectively, have no essential difference from each other in assuring a high adhesion because each system can select its optimum electrolytic condition. However, the etching under the indirect supply of AC current shown in FIG. 6 is deemed industrially preferable to the ethcing under the direct supply of AC or DC current because the indirect electric supply system has no resistive loss such as loss by contact resistance between the power supply roller and the foil and loss by resistance of the foil between the power supply rolled and the electrolyte as occurred in the direct electric supply system of FIG. 5, thus enabling the supply of a large amount of current which can continuously etch a belt-shaped rolled copper foil at a higher speed.

If it is desired to etch one side of the rolled copper foil 6 in the direct electric supply system, the foil 6 may be masked on the opposite side thereof and then introduced into the electrolyte. Alternately, in either case of the direct electric supply and indirect electric supply system, two sheets of the rolled copper foils may be put together and then introduced into the electrolyte 13. The latter process is very efficient.

This invention is further illustrated in the following examples:

Rolled oxigen free copper foils of 35 μm in thickness were roughened following steps 1 to 5 described in Examples 1 and 2 of Table 1, respectively. The comparative example was made by subjecting the same copper foil as used in Examples 1 and 2 to treatments which comprise only steps 3 to 5.

The average depth of the pores of the roughened surface thus obtained in Examples 1 and 2 was about 3 μm. A butylar phenolic adhesive was applied on the roughened rolled oxygen free copper foils thus obtained to a thickness of 20 to 25 μm, dried at a temperatured of 120° for 10 minutes, and then heated up to a temperature of 150° C. for 5 minutes to be partially cured. The copper foils thus adhesive-backed were put on a paper base phenol prepreg, pressed together at a temperature of 170° C. and a pressure of 80 kg/cm² for 40 minutes, and then allowed to cool to obtain three kinds of single sided copper-clad laminates. Table 2 shows the results of the test conducted on these laminates in accordance with JISC 6481. Table 2 also contains the characteristics of a commercial paper/phenol base copper-clad anodized roughened electrolytic copper foil laminate for reference. As can be seen in Table 2, the rolled copper foils thus etched have an adhesion strength which sufficiently means the specification and also is identical to the commercial paper/phenol substrate conventional copper-clad laminate in quality.

TABLE 1

| | | Example 1<br>Rolled oxygen<br>free copper | Example 2<br>Rolled oxygen<br>free copper | Comparative<br>example control<br>Rolled oxygen<br>free copper |
|---|---|---|---|---|
| Type of copper foil<br>Thickness of copper foil | | 35μ | 35μ | 35μ |
| | Treatment | | | |
| Step 1<br>(Etching) | Type of etching | DC | AC | |
| | Type of electrolyte | Hydrochloric acid | Hydrochloric acid | |
| | Concentration of electrolyte | 2.0 mol/l | 2.0 mol/l | |
| | Temperature of electrolyte | 85° C. | 70° C. | |
| | Current density | 25 A/dm² | 25 A/dm² | |
| | Period of electrolysis | 1 minute | 2 minute | |
| Step 2<br>(Washing<br>by water) | Temperature of water<br>Period of washing | Room temperature<br>1 minute | Room temperature<br>1 minute | |
| Step 3<br>(Washing<br>by | Type of acid<br>Temperature of acid<br>Concentration of acid<br>Period of washing | Sulfuric acid<br>room temperature<br>4%<br>2 minutes | Sulfuric acid<br>room temperature<br>4%<br>2 minutes | Sulfuric acid<br>room temperature<br>4%<br>2 minutes |
| Step 4 | Temperature of water | Room temperature | Room temperature | Room temperature |

TABLE 1-continued

|  |  | Example 1 Rolled oxygen free copper 35μ | Example 2 Rolled oxygen free copper 35μ | Comparative example control Rolled oxygen free copper 35μ |
|---|---|---|---|---|
| Type of copper foil |  |  |  |  |
| Thickness of copper foil |  |  |  |  |
| (Washing by water) Step 5 | Period of washing | 1 minute | 1 minute | 1 minute |
|  | Drying temperature | 120° C. | 120° C. | 120° C. |
|  | Period of drying | 30 seconds | 30 seconds | 30 seconds |

TABLE 2

| | Physical Property | | | | |
|---|---|---|---|---|---|
| | Peel strength (kg/10 mm) | | | | |
| Sample | Ordinary | After soldering resistance test at 260° C. | While heated at 150° C. | Soldering resistance (260° C.) | Heat resistance (130° C. × 30 minutes) |
| JISC 6485 Specification | 1.2 | 1.2 | 0.5 | 5 sec. | No abnormality |
| Example 1 | 1.80 | 1.64 | 1.10 | 20 sec. | No abnormality recognized |
| Example 2 | 2.10 | 1.80 | 1.29 | 23 sec. | No abnormality recognized |
| Comparative Example | 0.47 | 0.98 | less than 0.1 | 7 sec. | Blisters recognized |
| Commercial | 2.05 | 1.80 | 1.25 | 24 sec. | No abnormality recognized |

Furthermore, another two samples of single-sided copper-clad laminates were prepared by following the same conditions as in Examples 1 and 2, respectively. One of the two samples had a pore depth of 0.5 μm and the other 0.3 μm. A test conducted in accordance with JISC 6481 showed that the foil having a pore depth of 0.5 μm has an ordinary peel strength of 1.45 kg/10 mm and also meets other specifications whereas the foil having a pore depth of 0.3 μm has as low an ordinary peel strength as 0.46 kg/10 mm. As described above, unlike the conventional copper-clad laminate, a copper-clad laminate obtained in accordance with this invention does not leave copper oxide particles remained in the substrate, thus reducing the time required for etching and the conductor width and the conductor spacing of circuit pattern. This improves the high frequency response of the circuit in cooperation with the characteristics of the rolled foil itself.

What is claimed is:

1. A process for manufacturing a copper-clad laminate which includes a rolled copper foil as a circuit conductive material, comprising the steps of:
    preparing a tank filled with an electrolyte in which two parallel electrodes are disposed;
    introducing a rolled copper foil through a power supply/guide roller into said electrolyte so as to pass between said two electrodes under current supply from a power source to said electrodes and said power supply/guide roller to form an etched layer on surfaces of said rolled copper foil;
    applying an adhesive on the etched layer of said roller copper foil; and then
    pressing said rolled copper foil with a substrate made of a synthetic resin impregnated substrate put together to form a copper-clad laminate.

2. A process in claim 1, wherein said etched layer comprises pores formed thereon, said pores each having a depth in a range from 0.5 μm to 10 μm.

3. A process in claim 1, wherein said power source comprises DC power supply means with a positive terminal of said DC power supply means connecting to said power supply/guide roller while an negative terminal connecting to said two electrodes.

4. A process in claim 1, wherein said power source comprises AC power supply means.

5. A process in claim 1, wherein said power source comprises a combination of AC and DC power supply means.

6. A process in claim 1, wherein said roller copper foil comprises oxygen free copper.

7. A process in claim 1, wherein said rolled copper foil is belt-shaped and wherein at least one sheet of said belt-shaped roller copper foil is continuously carried lengthwise and an etched surface is simultaneously formed in the course of carriage.

8. A process in claim 1, wherein said rolled copper foil is belt-shaped and wherein two lapping sheets of said belt-shaped roller copper foils are continuously carried lengthwise and an etched surface is simultaneously formed in the course of carriage.

9. A process for manufacturing a copper-clad laminate which includes a rolled copper foil as a circuit conductive material, comprising the steps of;
    preparing a tank filled with an electrolyte in which two parallel electrodes are disposed;
    introducing a roller copper foil through a power supply/guide into said electrolyte so as to pass between said electrodes under supply of AC current to said two electrodes to form an etched layer on surfaces of said rolled copper foil;
    applying an adhesive on the etched layer of said roller copper foil; and then
    pressing said rolled copper foil with a substrate made of a synthetic resin impregnated substrate put together to form a copper-clad laminate.

10. A process in claim 9, wherein said etched layer comprises pores formed thereon, said pores each having a depth in a range from 0.5 μm to 10 μm.

11. A process in claim 9, wherein said rolled copper foil comprises oxygen free copper.

12. A process in claim 9, wherein said rolled copper foil is belt-shaped and wherein at least one sheet of said belt-shaped rolled copper foil is continuously carried lengthwise and an etched surface is simultaneously formed in the course of carriage.

13. A process in claim 9, wherein said rolled copper foil is belt-shaped and wherein two lapping sheets of said belt-shaped rolled copper foils are continuously carried lengthwise and an etched surface is simultaneously formed in the course of carriage.

* * * * *

UNITED STATES PATENT AND TRADEMARK OFFICE
CERTIFICATE OF CORRECTION

PATENT NO. : 4,434,022
DATED : February 28, 1984
INVENTOR(S) : OSAO KAMADA

It is certified that error appears in the above-identified patent and that said Letters Patent is hereby corrected as shown below:

Assignees should read as follows:

Hitachi Cable Ltd. and Kabushikigaisha Denkai Haku Kogyo

Signed and Sealed this

Twenty-first Day of May 1985

[SEAL]

Attest:

DONALD J. QUIGG

Attesting Officer

Acting Commissioner of Patents and Trademarks